United States Patent
Hwang

(10) Patent No.: US 7,281,323 B2
(45) Date of Patent: Oct. 16, 2007

(54) METHOD FOR MOUNTING ELECTRONIC COMPONENTS

(75) Inventor: Young-soo Hwang, Seongnam-si (KR)

(73) Assignee: Samsung Techwin Co., Ltd., Changwon (KR)

( * ) Notice: Subject to any disclaimer, the term of this patent is extended or adjusted under 35 U.S.C. 154(b) by 92 days.

(21) Appl. No.: 11/153,805

(22) Filed: Jun. 15, 2005

(65) Prior Publication Data

US 2006/0112545 A1 Jun. 1, 2006

(30) Foreign Application Priority Data

Nov. 30, 2004 (KR) .................. 10-2004-0099020

(51) Int. Cl.
*H05K 3/30* (2006.01)
(52) U.S. Cl. .............. 29/834; 29/836; 29/739; 29/740; 29/759; 29/832; 29/833; 382/151
(58) Field of Classification Search .......... 29/712, 29/720, 721, 759, 739–743, 832–834, 836; 156/538; 198/763; 382/151
See application file for complete search history.

(56) References Cited

U.S. PATENT DOCUMENTS 4,951,388 A * 8/1990 Eguchi et al. ............... 29/832
6,006,425 A * 12/1999 Fukukura et al. ............ 29/832
6,457,232 B1 * 10/2002 Isogai et al. ................. 29/833
6,516,514 B1 * 2/2003 Pruefer ....................... 29/832

FOREIGN PATENT DOCUMENTS

JP 2003-273582 A 9/2003

* cited by examiner

*Primary Examiner*—Minh Trinh
*Assistant Examiner*—Donghai D. Nguyen
(74) *Attorney, Agent, or Firm*—Drinker Biddle & Reath LLP

(57) ABSTRACT

A method for mounting electronic components is provided. The method comprises: rotating at least one rotation housing, and thereby correcting positions of a plurality of nozzle spindles depending on specified absorption positions of the electronic components; absorbing the electronic components by descending at least one nozzle spindle; rotating at least one rotation housing and rotating nozzle spindles to which the electronic components are absorbed, thereby correcting positions of the electronic components absorbed to the nozzle spindles depending on an inclination angle of specified positions for mounting the electronic components to a printed circuit board; moving the absorbed electronic components over the printed circuit board; and mounting the absorbed electronic components to the specified mounting positions of the printed circuit board.

9 Claims, 15 Drawing Sheets

METHOD FOR MOUNTING ELECTRONIC COMPONENTS

CROSS-REFERENCE TO RELATED PATENT APPLICATION

This application claims the benefit of Korean Patent Application No. 10-2004-0099020, filed on Nov. 30, 2004, in the Korean Intellectual Property Office, the disclosure of which is incorporated herein in its entirety by reference.

BACKGROUND OF THE INVENTION

1. Field of the Invention

The present invention relates to a method of mounting electronic components and a component mounting apparatus implementing the method More particularly, the present invention relates to a method of mounting electronic components wherein electronic components such as, for example, an integrated circuit, a diode, a condenser, or a resistor are automatically mounted. The present invention also relates to a component mounting apparatus implementing the method.

2. Description of the Related Art

Component mounting apparatuses are the most important of component mounting and assembling apparatuses for mounting components to a printed circuit board (PCB). They receive various kinds of electronic components from a component supply apparatus, transfer them to a mounting position of the PCB, and mount them to the PCB.

In general, component mounting apparatuses comprise a bed and X and Y axis movement mechanisms for guiding the PCB to a predetermined position, a component supply unit for supporting various kinds of electronic components to be mounted to the PCB, and a head unit for absorbing or detaching the components. The head unit is vertically moved in order to mount the electronic components supported by the component supply unit to the PCB and Recently, a plurality of nozzle spindles have been provided to component mounters. The nozzle spindles have been arranged in a line in a head assembly in order to absorb, either serially or in parallel, a plurality of electronic components, parallelly move the absorbed plurality of electronic components to a conveyor, and mount to the PCB, either serially or in parallel, the electronic components moved to the conveyor, thus increasing the efficiency of mounting components.

However, in these component mounters, the size of nozzle spindles provided to the component mounter in a line increases with their number, whereby the whole size of the head assembly increases. Therefore, the number of nozzle spindles provided in the head assembly should be limited.

As disclosed in Japan Unexamined Patent Application Publication No. 2003-273582, in order to solve such a problem, three revolver-type head assemblies 11 are arranged in a line at a head unit 10 provided to the component mounting apparatus, as shown in FIG. 1 and FIG. 2. Each nozzle spindle 40 provided in each head assembly 11 is arranged apart from each other along the same circumference from a center of a spline shaft 35 (see FIG. 2) and a nozzle 42 is coupled to the lower side of each nozzle spindle 40. These head assemblies 11 are fixed to a head frame 12.

The nozzle spindles 40 provided in each head assembly 11 are selected to descend by a nozzle selection mechanism 70 and descended by a nozzle lift mechanism 80. Further, each nozzle spindle 40 is rotated by a nozzle rotation mechanism 60. That is, the nozzle spindles 40 coupled to a spline shaft 35 are rotated because the spline shaft 35 is rotated by the nozzle rotation mechanism 60, The head assembly 11 provided in the component mounting apparatus having such a structure will be described in detail with reference to FIG. 2. One head assembly 11 is provided with a plurality of nozzle spindles 40 installed along the same circumference about the spline shaft 35.

The nozzle holder 50 is coupled to the spline shaft 35, and the nozzle spindles 40 are arranged along the same circumference about the spline shaft 35 of the nozzle holder 50 and are able to be vertically moved.

The nozzle spindles 40 are provided to allow them to ascend or descend. The spline shaft 35 is rotated by driving the nozzle rotation mechanism 60 that comprises a motor for rotating nozzles, whereby the nozzle spindles 40 and the nozzle holder 50 coupled to the spline shaft 35 are rotated.

A nozzle selection mechanism 70 and a nozzle lift mechanism 80 are provided in the head assembly 11 to separately select the nozzle spindles 40 to descend. The nozzle selection mechanism 70 comprises a compressed air supply unit 71 and a nozzle selection valve 72 and injects compressed air into a pressurized air supply unit 32 corresponding to the nozzle spindles 40 selected to descend. In this case, the pressurized air supply unit 32 is coupled to the head assembly 11, is a space inside an air cylinder block 30 arranged at an upper side of the nozzle holder 50, and is connected to each nozzle spindle 40.

Therefore, a piston 52 formed within the pressurized supply unit and an air cylinder shaft 53 coupled to a lower side of the piston descend when air of a positive pressure is injected into the pressurized air supply unit arranged at an upper side of the nozzle spindles 40 selected to descend. Thereby, a lower end 53a of the air cylinder shaft 53, an upper end 40a of the nozzle spindles coupled to the lower end 53a of the air cylinder shaft 53, and an upper surface 85a of operation of a spline nut 85 are the same height, making the air cylinder shaft 53, the nozzle spindles 40, and the spline nut 85 become one piece. The spline nut 85 is coupled to the nozzle lift mechanism 80 having a cam follower 84, an eccentric cam 82, and a drive motor 81 and is vertically translated, whereby the nozzle spindles 40 coupled to the spline nut 85 descend.

The vacuum absorption mechanism 90 is provided to absorb electronic components. The vacuum absorption mechanism 90 provides the nozzle spindles 40 with air of a negative pressure from outside and air of a negative pressure from a negative-pressure air supply unit 91 individually, by means of absorption valves 92 provided on the outside of the nozzle holder 40, so that the nozzle spindles 40 individually absorb electronic components. The revolver type of head unit has a small size but can mount many electronic components.

A conventional head assembly 11 for mounting components having such a structure is provided with the nozzle lift mechanism 80 to descend the nozzle spindles 40. The nozzle lift mechanism 80 comprises an eccentric cam 82, a cam follower 84, and a spline nut 85. Thus, its lift mechanism becomes complicated, its weight is heavy, and it occupies much space. Therefore, it is difficult for the nozzle lift mechanism to cope with various work environments and to modularize the head assembly.

Further, in a conventional component mounting apparatus, a positional difference occurs when the conveyor is not accurately placed during assembly or when the PCB is not placed parallel to the conveyor when the PCB is positioned. However, in the component mounting apparatus disclosed in Japan Unexamined Patent Application Publication No. 2003-371456, the nozzle spindles 40 rotate as the spline shaft 35 rotates, so that it is possible to compensate for a difference in a specified mounting position on the electronic components or the PCB.

However, when mounting the electronic components on the PCB, the electronic components mounted to the lower side of the nozzle spindles 40 are also rotated when rotating the nozzle spindles 40 in order to compensate for the difference, whereby the electronic components rotate to a certain angle from a specified mounting position of the PCB and are therefore not put in a right position.

Such a problem also occurs in a case where two or more head units are provided to the component mounting apparatus. That is, in a case where a Y axis position of one head unit is the same as that of the PCB corresponding to the Y axis position of one head unit in order to composite for the difference, a Y axis position of the other head unit is not the same as that of the PCB corresponding to the Y axis position of the other head unit. Thereby, it is impossible to mount electronic components to the PCB because nozzles in two or more head units "provided to the component mounting apparatus" descend at the same time.

SUMMARY OF THE INVENTION

Various embodiments of the present invention provide a method of mounting electronic components and a component mounting apparatus employing the method. In the method, a plurality of nozzle spindles have a revolver shape and are capable of absorbing or mounting many electronic components with high speed.

In an embodiment, the present invention also provides a method of mounting electronic components in which a plurality of nozzle spindles provided in one head assembly descend at the same time and absorb components. The head assembly is also capable of absorbing or mounting electronic components in an accurate position depending on a position state of the electronic components that arrive at a component supply unit and a position state of PCB transferred by a conveyor unit. The present invention also provides a component mounting apparatus employing the method.

In an embodiment, the present invention further provides a component mounting apparatus with a decreased total weight and operating with high speed. A nozzle lift mechanism for descending nozzle spindles has a simple structure and uses a small number of elements and is provided with head assemblies having a structure available for modularization.

According to an embodiment of the present invention, there is provided a method of mounting electronic components comprising: rotating at least one rotating housing, and thereby correcting positions of each nozzle spindle depending on positions of electronic components that arrive at a component supply unit; absorbing the electronic components from the component supply unit by descending at least one nozzle spindle; rotating at least one rotation housing and making independently to rotate at least the nozzle spindles in which the electronic components are absorbed, and correcting positions of the electronic components absorbed into the nozzle spindles depending on an inclination angle of PCB; moving the absorbed electronic components to the PCB; and mounting the absorbed electronic components to the PCB.

A gap between the nozzle spindles arranged opposite to each other about the rotation housing in one head assembly may be one or more times a gap between centers of the adjacent component supply units. The operation of absorbing the electronic components may comprise an operation in which a plurality of nozzle spindles in one head assembly are descended at the same time.

According to another embodiment of the present invention, there is provided a component mounting apparatus for absorbing electronic components that arrive at a component supply unit, moving them to a horizontal movement mechanism, and mounting them on the PCB. In an embodiment, the component mounting apparatus comprises a plurality of head assemblies arranged to be parallel to each other.

One head assembly may comprise a rotation housing, a plurality of nozzle spindles, a housing rotation mechanism, and a nozzle rotation mechanism.

The rotation housing may be mounted to a body mounted in the horizontal movement mechanism. The rotation housing may be rotatably mounted on the body, the rotation housing may include a plurality of spindle housing holes therethrough, said holes accurately spaced about a central axis at a radial distance therefrom. The nozzle spindles may be disposed in the vertical holes, each spindle of the plurality including a nozzle for picking up electronic components. The housing rotation mechanism may rotate the rotation housing. The nozzle rotation mechanism may make the nozzle spindles rotate at the same time.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
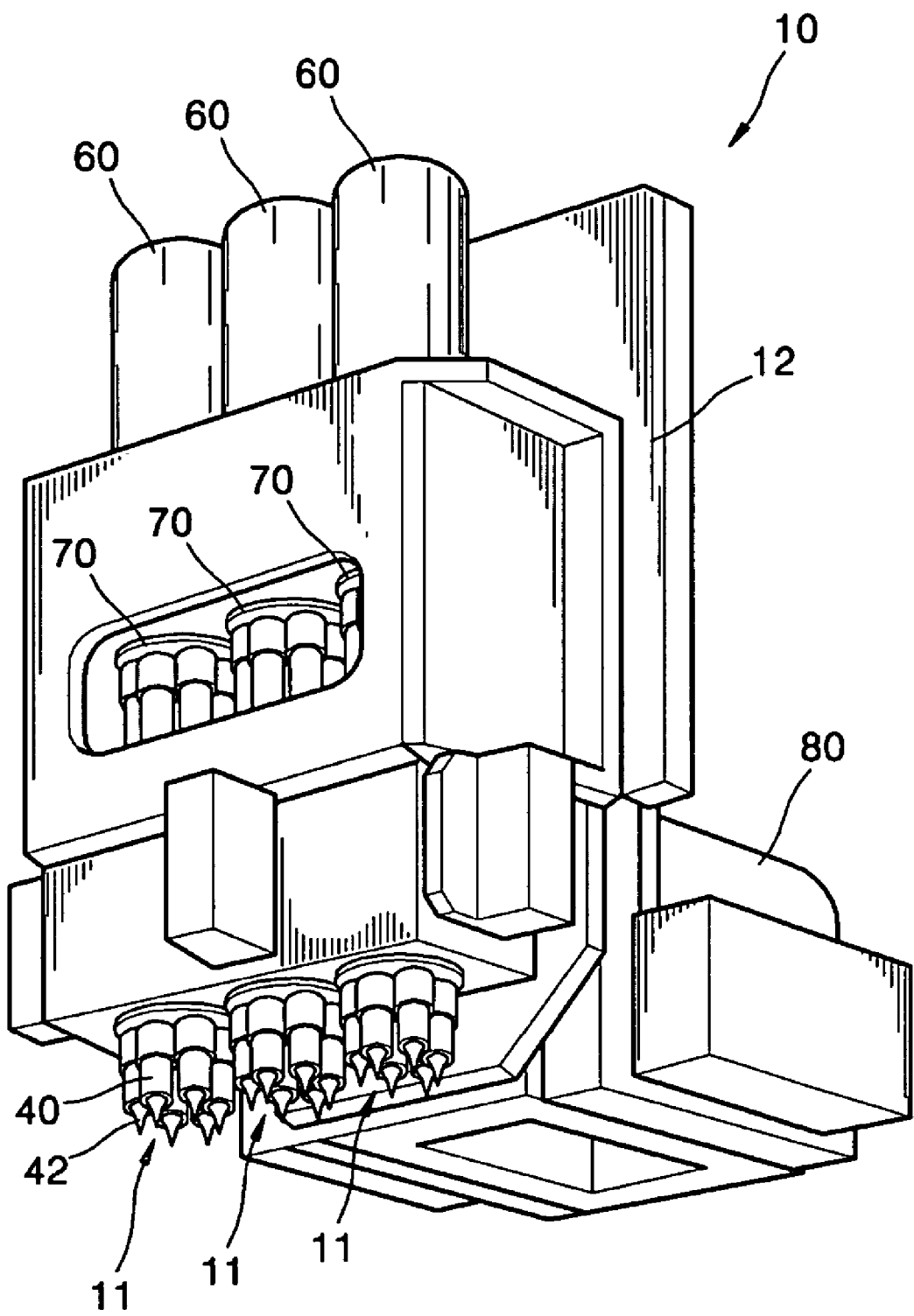
FIG. 1 is a schematic view illustrating a head unit comprising a conventional component mounting apparatus.
Figure 2:
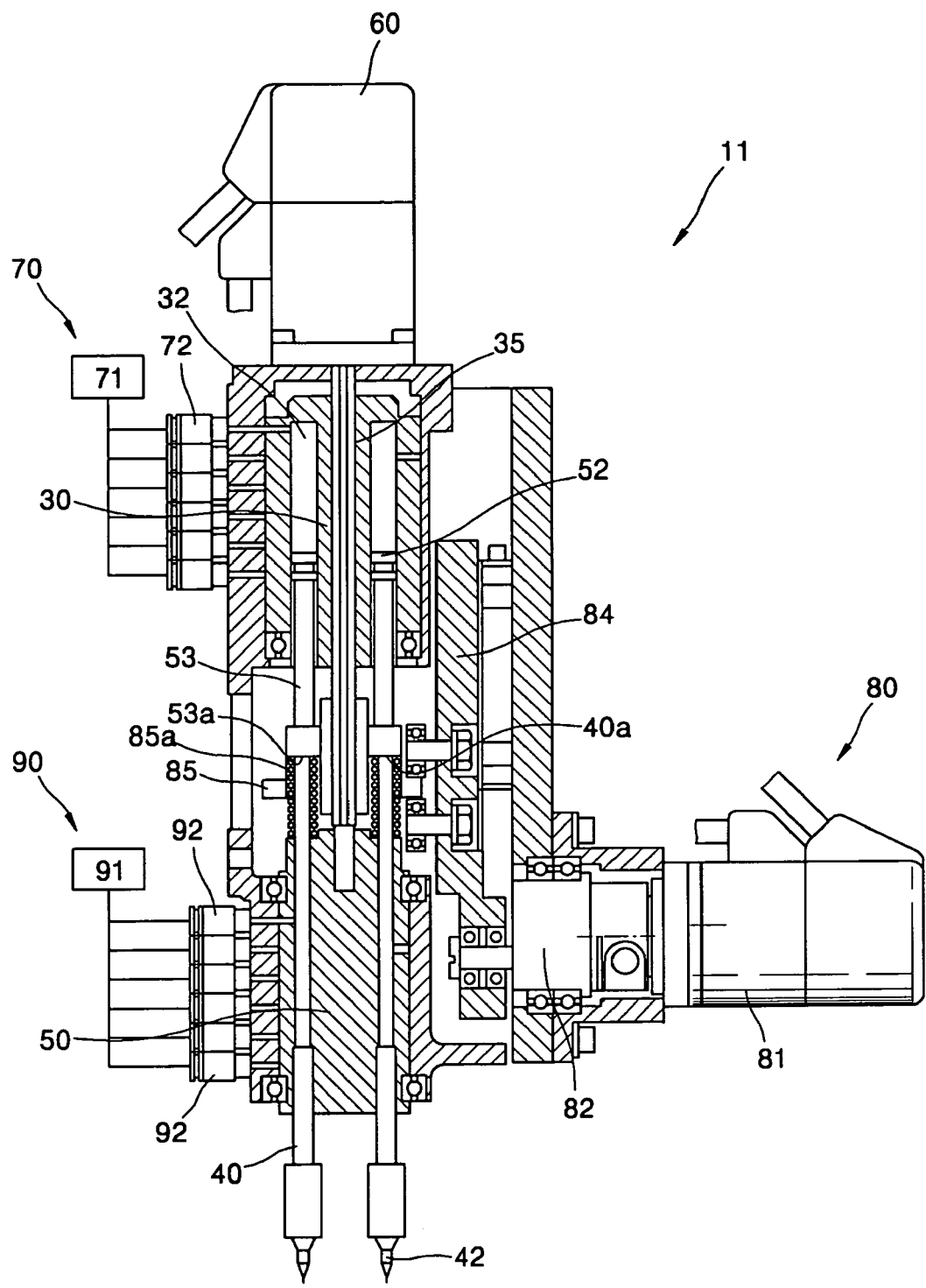
FIG. 2 is a cross-sectional view illustrating a head assembly provided to the component mounting apparatus shown in FIG. 1.
Figure 3:
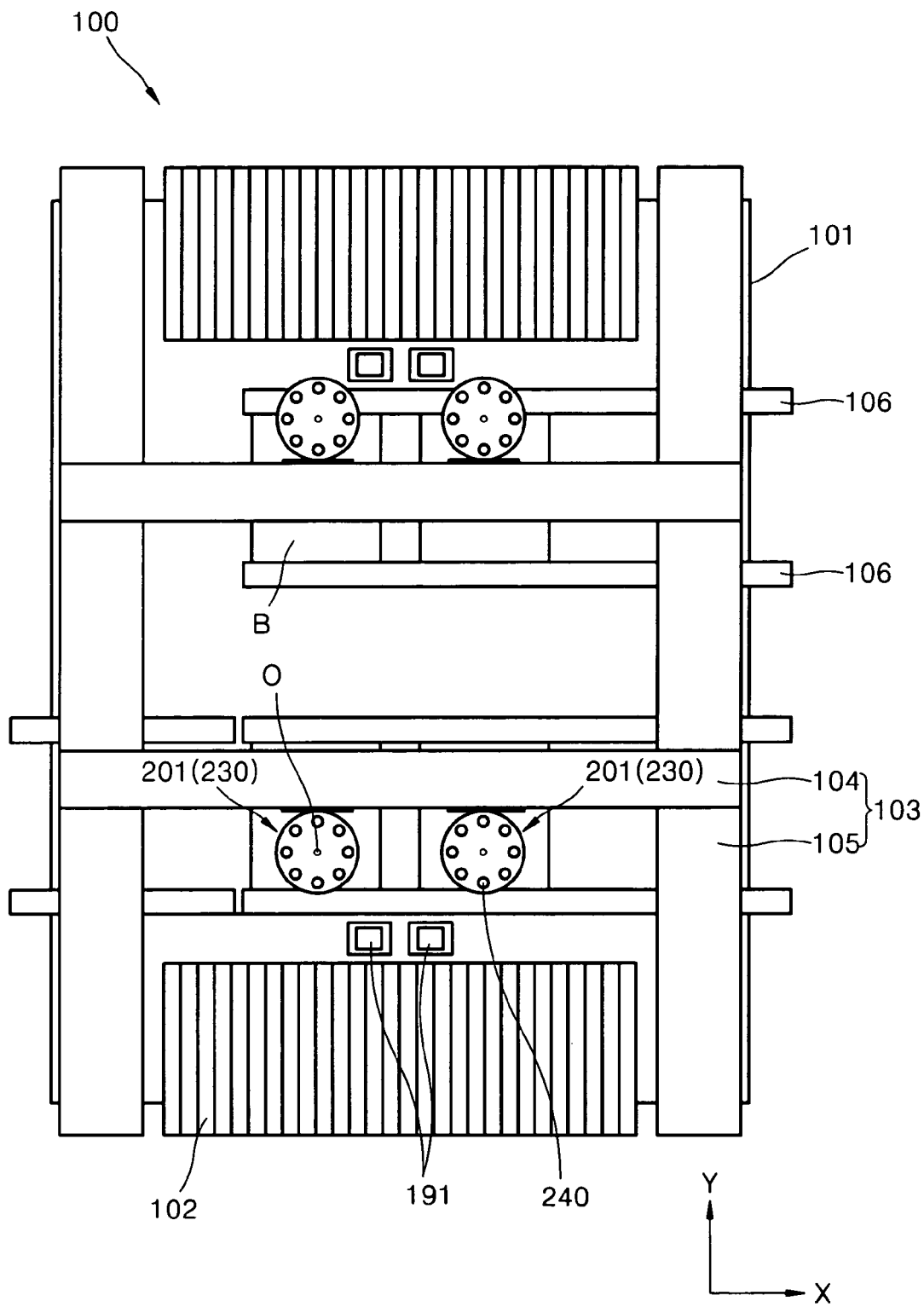
FIG. 3 is a top plan view illustrating a component mounting apparatus employing a method of mounting electronic components according to an embodiment of the present invention.

FIG. 3 is a top plan view illustrating a component mounting apparatus employing a method of mounting electronic components according to an embodiment of the present invention. The component mounting apparatus is a device for absorbing electronic components that arranged at a component supply unit, moving them to a horizontal movement mechanism, and mounting them on a PCB.

As shown in FIG. 3, the component mounting apparatus 100 comprises a plurality of head assemblies 201, a component supply unit 102, a conveyor unit 106, and a horizontal movement mechanism 103. A bed 101 may comprise the component supply unit 102 for supplying electronic components and the conveyor unit 106 for transferring the PCB B in the X axis direction.

The horizontal movement mechanism 103 is coupled to the bed 101. The horizontal movement mechanism 103 performs a function of moving a plurality of head assemblies 201 from a component absorption position of the component supply unit 102 to the PCB B in a horizontal direction.

The horizontal movement mechanism 103 generally comprises an X axis direction movement mechanism 104 for moving horizontally a plurality of head assemblies 201 in the X axis direction and a Y axis movement mechanism 105 for moving horizontally the head assemblies 201 in the Y axis direction.

The head assemblies 201 are coupled to the X axis movement mechanism 104 to move horizontally along the X axis movement mechanism 104. In an embodiment, both ends of the X axis movement mechanism 104 are mounted for horizontal movement to the Y axis movement mechanism 105 perpendicular to the X axis movement mechanism 104.

Therefore, when the X axis movement mechanism 104 is moved along the Y axis movement mechanism 105, the head assembly 201 mounted to the X axis movement mechanism 104 moves horizontally in the Y axis direction. The head assembly 201 also moves horizontally in the X axis direction along the X axis movement mechanism 104.

A plurality of nozzle spindles 240 are arranged around the circumference in each head assembly 201. A plurality of head assemblies 201 are separably coupled to a head frame 108, and a plurality of nozzle spindles 240 provided in the head assembly 201 absorb electronic components from the component supply unit 102 and mount them to the PCB B arranged on the conveyor unit 106.

In an embodiment, a first photographing unit 191 may be arranged between the component supply unit 102 and a conveyor unit 106. The first photographing unit 191 photographs the electronic components absorbed to the nozzle spindles 240 from the component supply unit 102, checks on the state of the electronic components, and signals the head assembly 201 to correct a position of the electronic components depending on an inclination angle β1 of the PCB B. In the embodiment shown in FIG. 3, the first photographing unit 191 is provided to the bed 101, but a position of the first photographing unit 191 is not limited to the bed 101.

A second photographing unit (not shown) may be provided to the head assembly 201. In an embodiment, the second photographing unit photographs a fiducial mark of the PCB transferred by a conveyor unit and a pickup point of the electronic components that are arranged at the component supply unit 102 and performs a function of acquiring position information on the electronic components or the PCB B. The second photographing unit may perform a function of the first photographing unit 191. A mirror unit for applying images of absorbed electronic components to the second photographing unit may be provided to the head assembly 201.

The head assembly 201 is provided with a rotation housing 230 for a housing rotation mechanism to allow it to rotate. A plurality of spindle housing holes are formed along the same circumference about a central portion O in the rotation housing 230. The nozzle spindles 240 are inserted into the spindle housing holes. The nozzle spindles 240 can ascend, descend, and turn on their own axes. The nozzle spindles 240 may be interlocked with, and therefore rotate with, the rotation housing 230 or may rotate independently.

Figure 4:
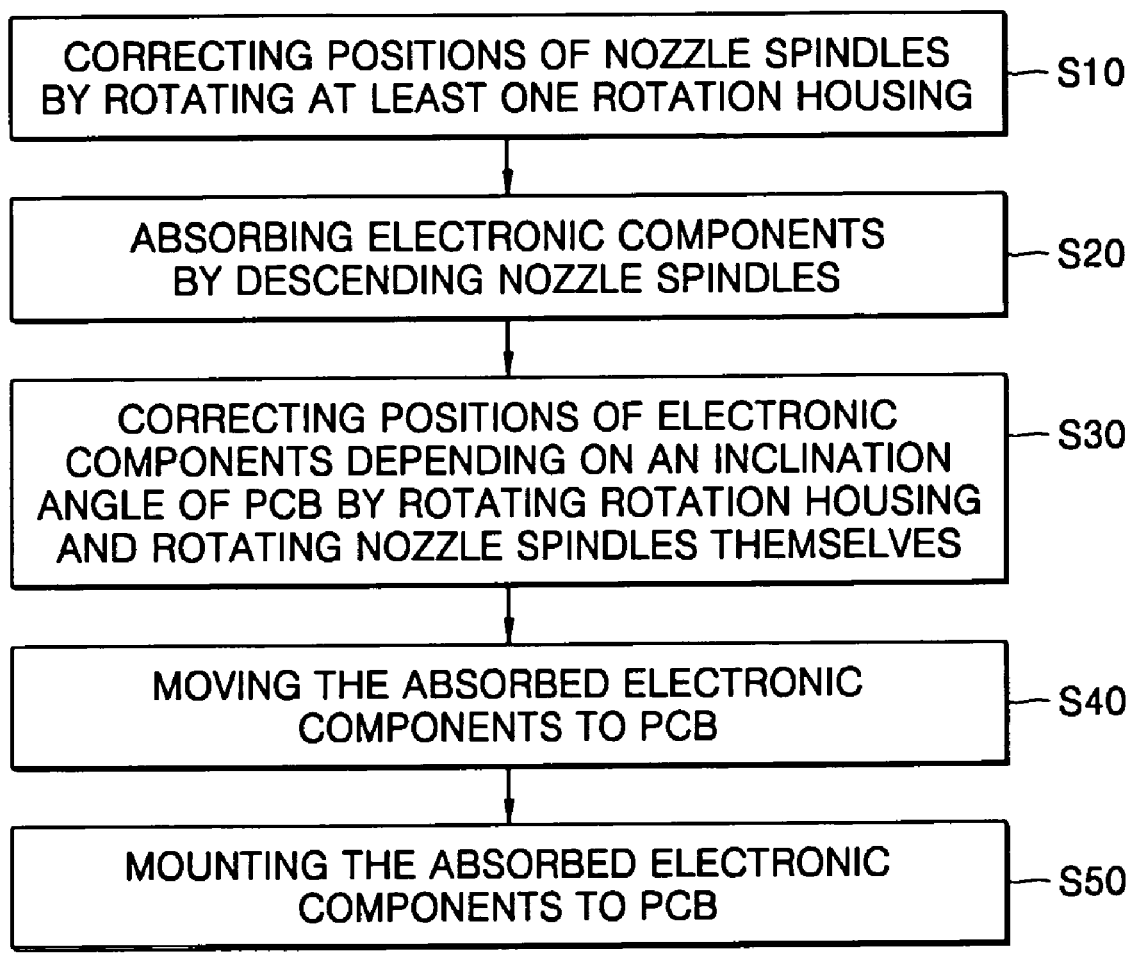
FIG. 4 is a block diagram illustrating the operations of a method of mounting electronic components according to an embodiment of the present invention.

In an embodiment, a method of mounting electronic components employed in a component mounting apparatus having such a structure according to the present invention, as shown in FIG. 4, comprises operation S10 of correcting positions of the nozzle spindles before absorbing electronic components, operation S20 of absorbing the electronic components, operation S30 of correcting positions of the electronic components absorbed depending on a position of a PCB, operation S40 of moving the head assembly to the PCB, and operation S50 of mounting the electronic components to the PCB.

Operation S10 of correcting positions of the nozzle spindles 240 before absorbing electronic components comprises correcting positions of each nozzle spindle 240 rotating in association with the rotation housing 230 by rotating at least one rotation housing 230 depending on an inclination angle α1 of the electronic components that arrive at the component supply unit 102.

Figure 5:
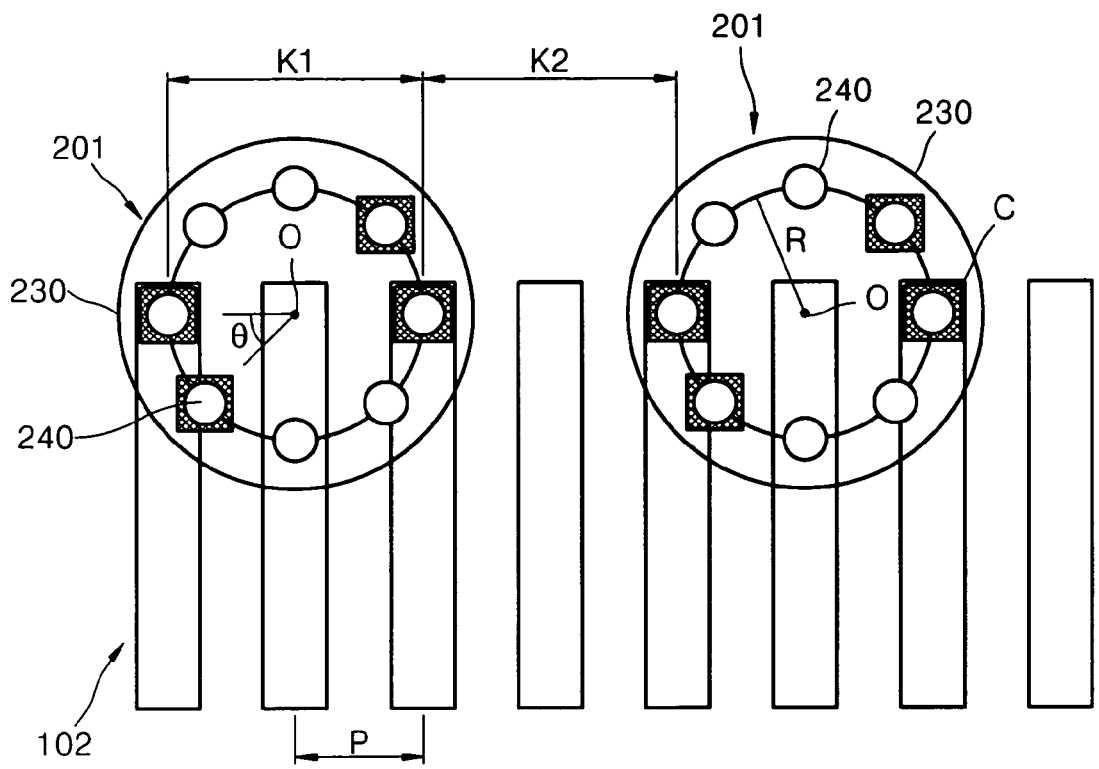
FIG. 5 is a top plan view illustrating an arrangement state of nozzle spindles provided to each head assembly shown in FIG. 4.

In an embodiment, as shown in FIG. 5, it is preferable that a gap K1 between the nozzle spindles 240 arranged opposite to each other about a central portion O of the rotation housing in one head assembly 201 becomes one or more times the distance between adjacent specified absorption positions. In other words, nozzle spindles 240, which are arranged opposite to each other about the central portion O of the rotation housing and descend at the same time and absorb components, should be separated by at least the distance of a gap P between centers of the components supply units 102.

That is, when a gap K1 between two nozzle spindles arranged opposite to each other about the center O of the rotation housing is the same as or two or three times a gap P between centers of the component supply units 102 corresponding to two nozzle spindles, two nozzle spindles 240 can absorb a plurality of electronic components C at the same time, thus decreasing a time for absorbing the electronic components.

Further, the rotation housing 230 rotates by a fixed angle θ after two nozzle spindles 240 absorb components C at the same time because the rotation housing 230 can rotate and each nozzle spindle 240 is situated around the same radius R from the central portion O. Next, two nozzle spindles 240 can repeat a process of absorbing components C because they are situated on the component supply unit 102, thus reducing a time for absorbing the components.

A gap between the nozzle spindles 240 provided to one rotation housing 230 and situated adjacent to each other may be the same, whereby the rotation angle of the rotation housing 230 may become constant. For example, as shown in FIG. 5, eight nozzle spindles can absorb electronic components whenever rotating 45° if they are arranged in one head assembly.

Further, in operation S10, because at least one head assembly 201 is moved along the X axis, a gap K2 between the nozzle spindles 240 that are provided to head assemblies 201 which are adjacent to each other and arranged in a line may be one or more times a gap P between centers of adjacent component supply units. Thereby, a plurality of head assemblies 201 can absorb components more rapidly because they can absorb components at the same time.

In an embodiment, the X axis movement mechanism is able to arrange to be inclined a little because both ends of X axis movement mechanism 104 (see FIG. 3) of the component mounting apparatus are made to drive independently of each other by the Y axis movement mechanism 105 (see FIG. 3). The head assembly 201 mounted to the X axis movement mechanism is inclined depending on an inclination angle of the component supply unit. Thus, the head assembly 201 absorbs electronic components corresponding to the nozzle spindles 240 of different head assemblies 201 at the same time.

Figure 6:
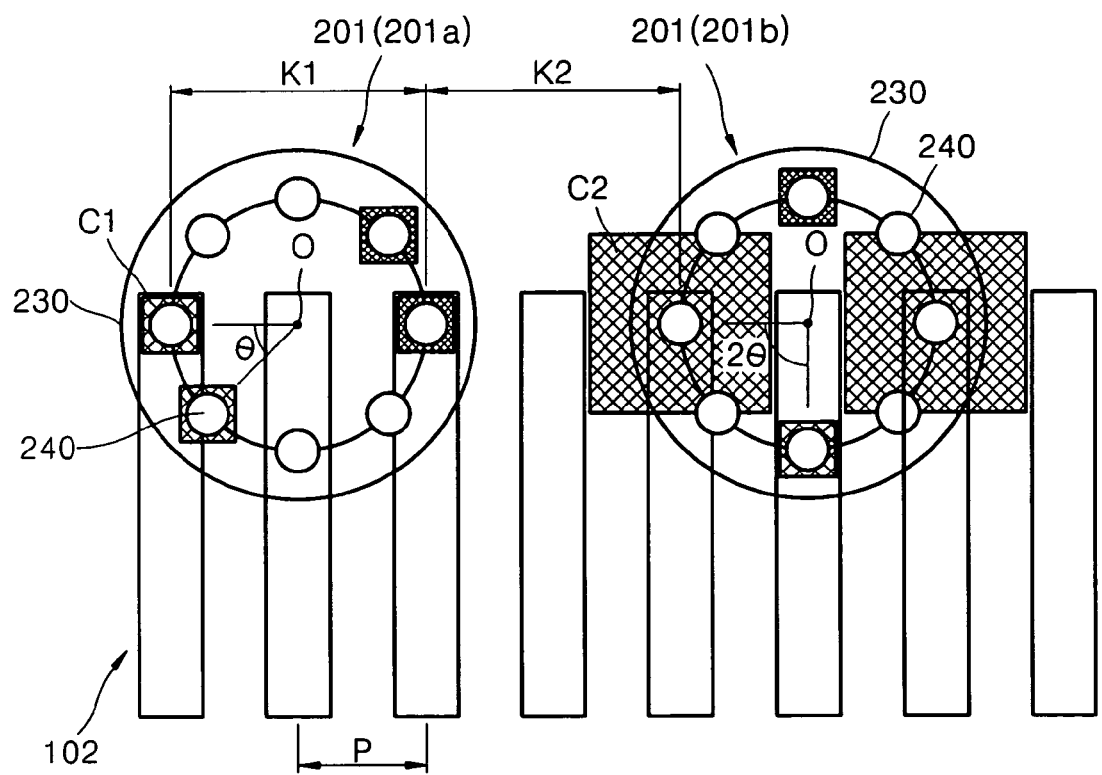
FIG. 6 is a top plan view illustrating the nozzle spindles of FIG. 5 in an absorbed state with different-size electronic components.

On the other hand, as shown in FIG. 6, the rotation housing 230 may absorb different-size electronic components C1, C2 at the same time in nozzle spindles provided to a separate head assemblies 201 by rotating with different speeds in each head assembly 201. That is, the nozzle spindles 240 provided in different head assemblies 201 can absorb a different-size electronic components C1, C2 at the same time because in the first head assembly 201a, the rotation housing 230 rotates by 45° (θ), thereby absorbing the electronic components at eight nozzle spindles, however, in the second head assembly 201b, the rotation housing 230 rotates by 90° (2θ), thereby absorbing electronic components at four nozzle spindles 240 not adjacent to each other.

Figure 7:
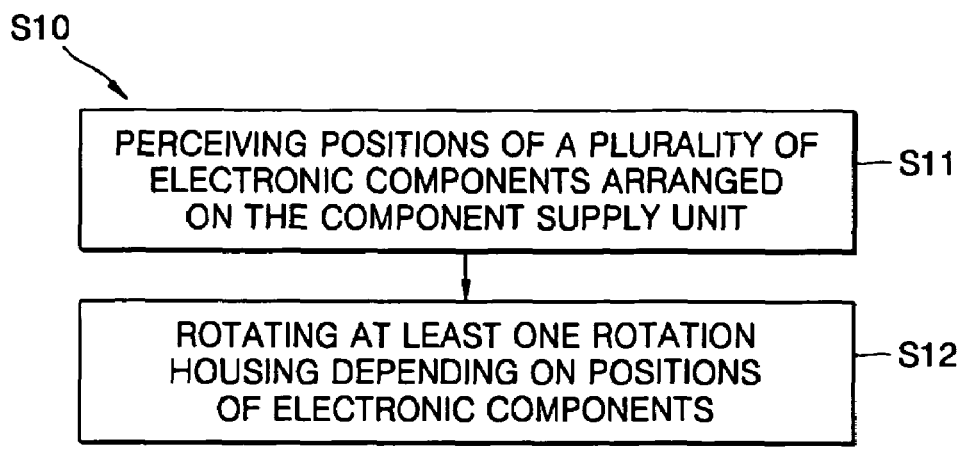
FIG. 7 is block diagram illustrating operations included in an embodiment of operation S10 of FIG. 4.

In an embodiment, as shown in FIG. 7, operation S10 correcting positions of the nozzle spindles comprises operation S11 of confirming an inclination angle α1 of the electronic components C by photographing a plurality of electronic components C that arrive at the component supply unit, that is, a specified absorption position and operation S12 of rotating at least one rotation housing depending on an inclination angle α1 of the electronic components C.

Figure 8A:
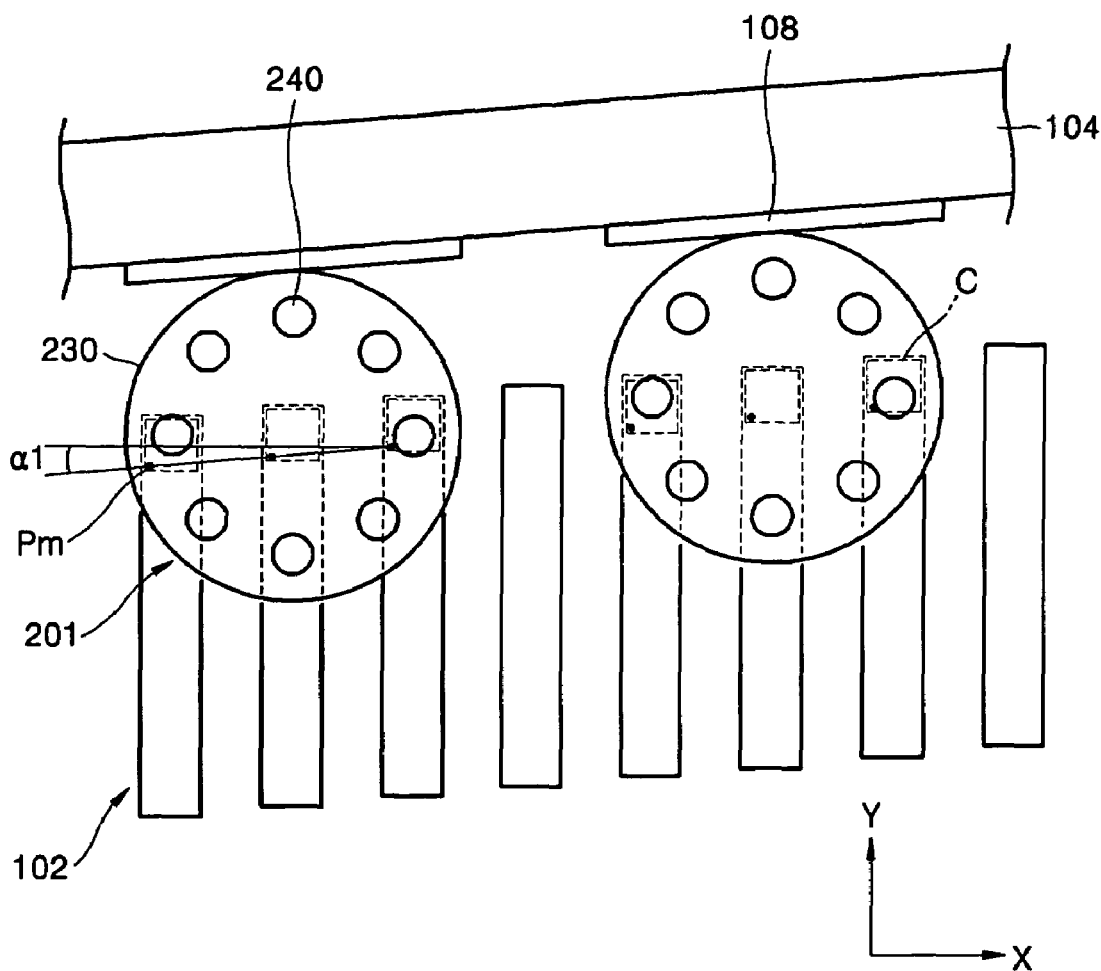
FIGS. 8A and 8B are top plan views illustrating operation of the nozzle spindles at the operations shown in FIG. 7.
Figure 8B:
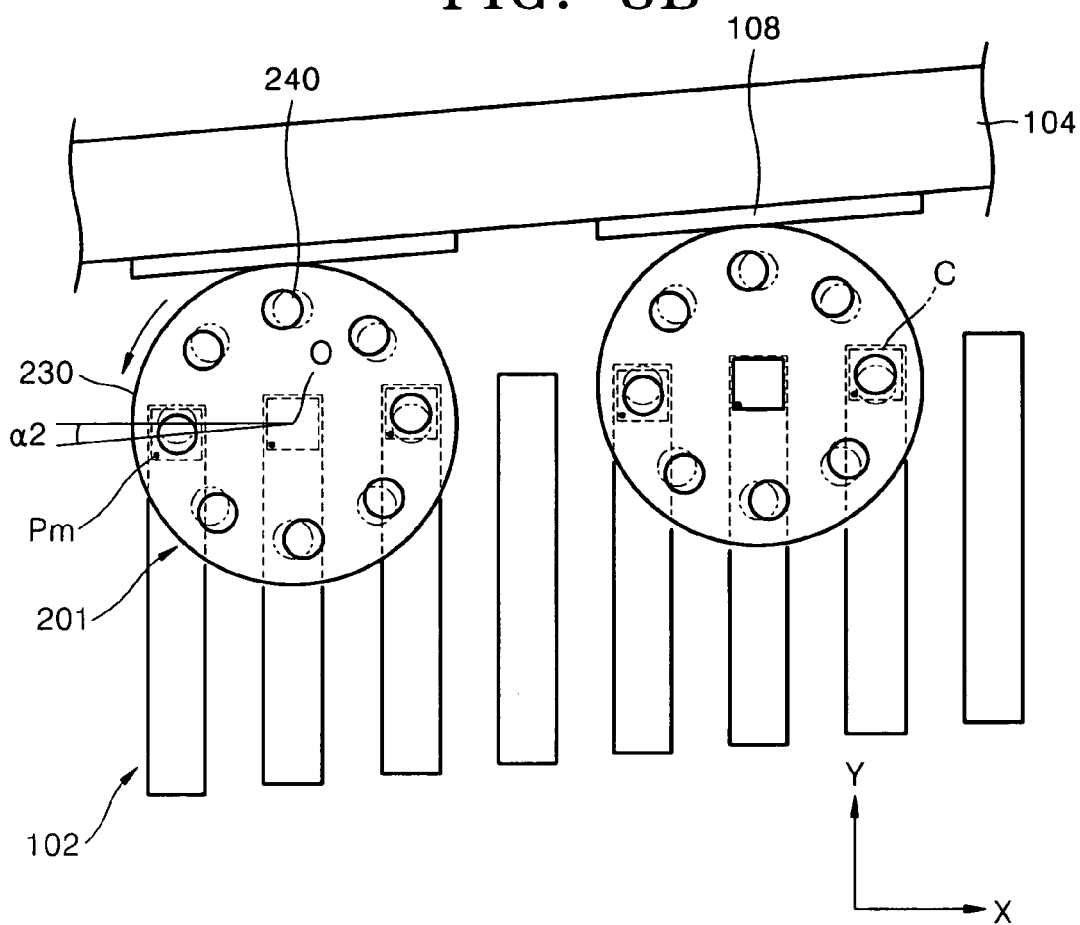

Operation S10 of correcting positions of the nozzle spindles, for example, as shown in FIGS. 8A and 8B, comprises on the head assembly 201 moving toward the component supply unit 102 and the second photographing unit (not shown) provided to the head assembly 201 photographing a pickup point Pm of the electronic components. Therefore, it is possible to perceive angle α1 between the pickup point Pm of the electronic components adjacent to photographed images. The nozzle spindles 240 are rotated by rotating the rotation housing 230 by a fixed angle α2, whereby each nozzle spindle 240 is situated at the pickup point Pm corresponding to the nozzle spindles 240.

That is, as shown in FIG. 8A, the electronic components C that arrive at the component supply unit 102 and wait for absorption should be arranged to be parallel to the X axis. However, a mounting error may occur in the component supply unit 102. As a result, during operation S11 of photographing a plurality of electronic components that arrive at the component supply unit, the component supply unit 102 may incline by a fixed angle α1 relative to the X axis when the electronic components are photographed and images are analyzed. Therefore, the electronic components C to be absorbed may also incline by a fixed angle α1.

Therefore, a method of mounting electronic components according to the present invention comprises operation S12 of rotating at least one rotation housing in order to absorb the electronic components C having such an inclination angle α1. That is, as shown in FIG. 8B, an angle α2 of the nozzle spindles 240 arranged to be opposite to each other about the central portion O of the rotation housing should be also changed depending on the inclination angle α1 of the electronic components. In an embodiment of the present invention, each of the nozzle spindles 240 scheduled to absorb is arranged depending on an inclination angle α1 of the electronic components by rotating the rotation housing 230 about its central portion O and thereby also rotating the nozzle spindles 240. Thereafter, the nozzle spindles 240 provided to a plurality of head assemblies 201 can descend and absorb the electronic components at the same time.

Figure 9:
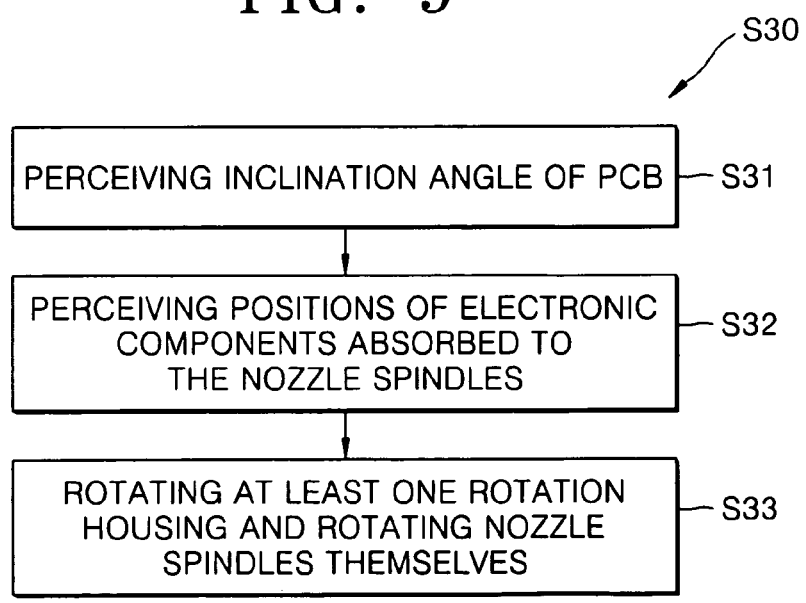
FIG. 9 is a block diagram illustrating operations included in an embodiment of operation S30 of in FIG. 4.

On the other hand, as shown in FIG. 9, operation S30 of correcting positions of the electronic components C absorbed to the nozzle spindles 240 depending on an inclination angle β1 of the PCB B comprises operation S31 of perceiving an inclination angle of a specified mounting position of the PCB, operation S32 of perceiving positions of the electronic components absorbed to the nozzle spindles 240, and operation S33 of correcting positions of the electronic components C depending on the specified mounting position by making the nozzle spindles 240 independently rotate concurrently with a rotation of at least one rotation housing 230.

Figure 10A:
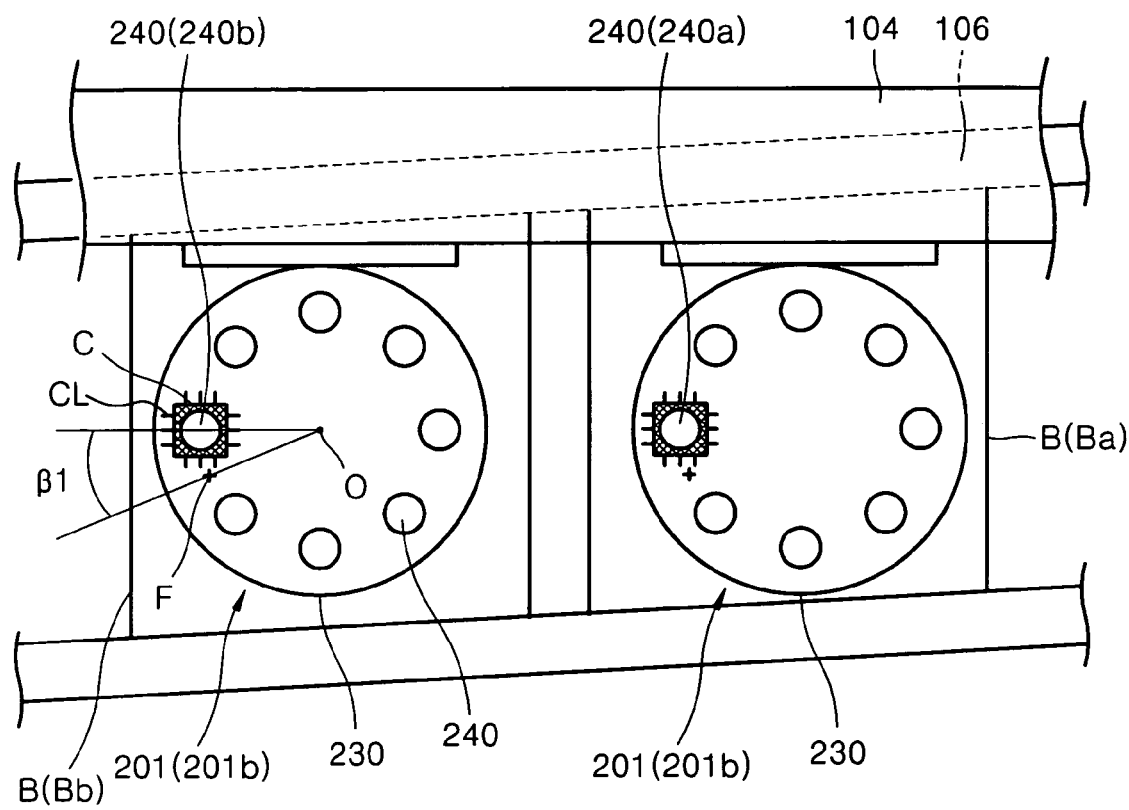
FIGS. 10A to 10C are top plan views illustrating the operation of the nozzle spindles at the operations shown in FIG. 9.
Figure 10B:
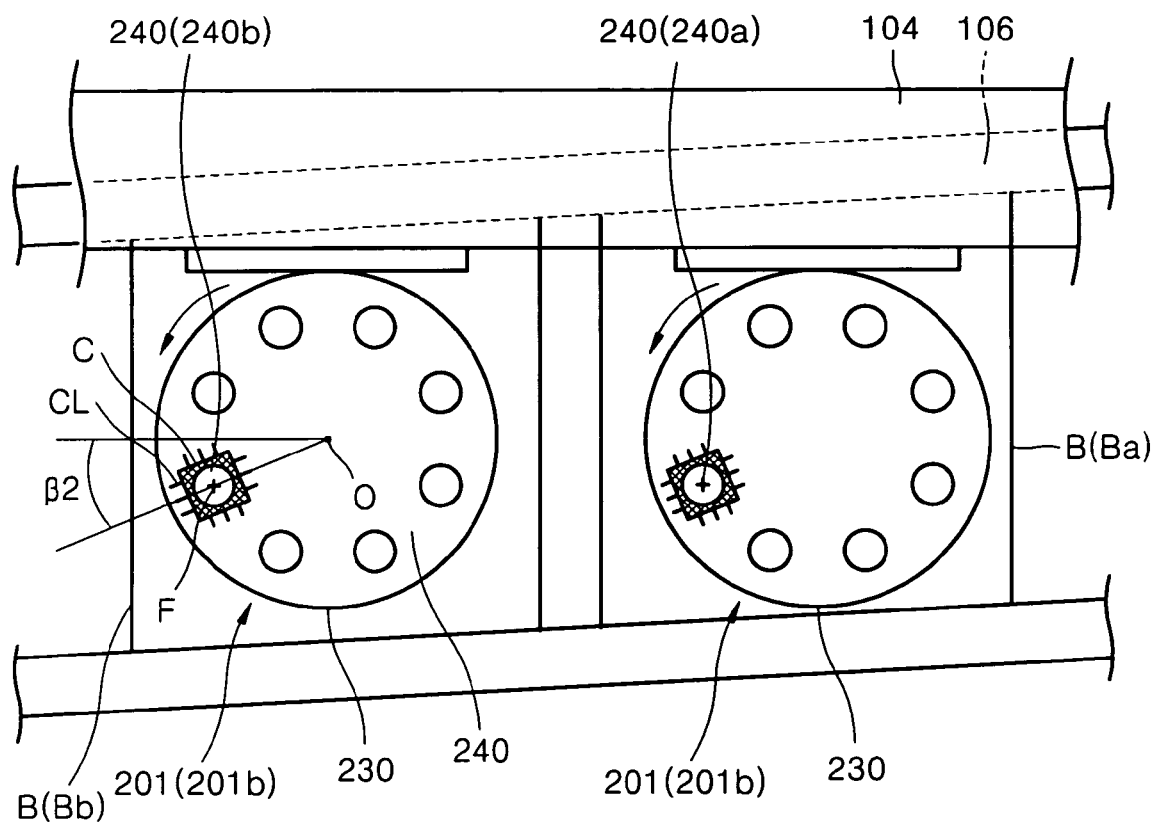
Figure 10C:
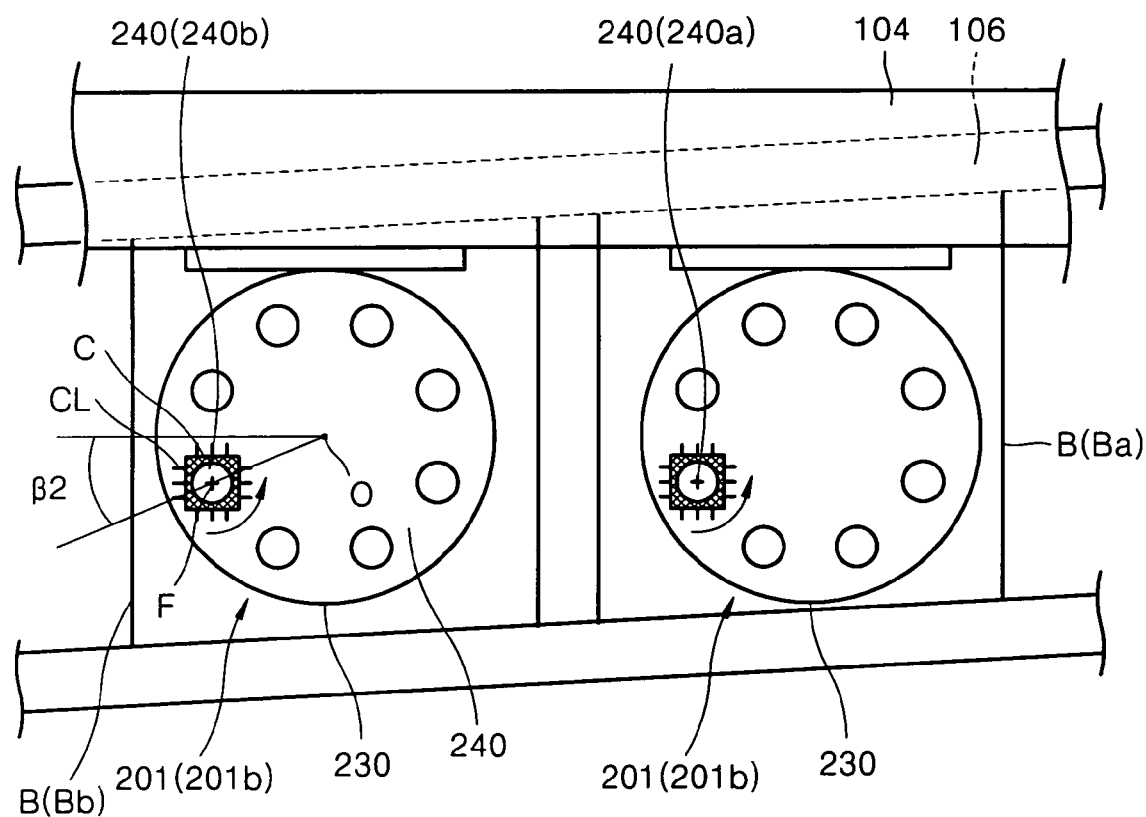

In an embodiment, as shown in FIGS. 10A to 10C, operation S31 of perceiving an inclination angle of the specified mounting position comprises photographing a fiducial mark F of the PCB B with the second photographing unit coupled to a head assembly 201. Further, operation S32 of perceiving a position of electronic components absorbed to the nozzle spindles comprises photographing a lower side of the electronic components absorbed to the nozzle spindles from the first photographing unit 191 (see FIG. 3) coupled to the bed.

Specifically, as shown in FIG. 10A, the conveyor unit 106 is generally arranged to be parallel to the X axis and thus the PCB B is transferred to be parallel to the X axis. However, the PCB B may be inclined by a fixed angle β1 relative to the X axis due to a mounting error when the PCB is mounted on the conveyor unit 106 or due to an arriving error when it arrives at the PCB B in the conveyor unit 106.

Therefore, the head assembly 201 that absorbs the electronic components C moves to the PCB B and goes through operation S31 of photographing the fiducial mark F of the PCB and perceiving the inclination angle β1 of the PCB B. In this case, for convenience of explanation, it is regarded that the electronic components C are provided with leads CL connected to the PCB and the leads CL are arranged to be parallel to X axis.

Thereafter, operation S32 of perceiving a position of electronic components is taken after the head assembly 201 is moved from the first photographing unit 191 (see FIG. 3) depending on a movement of the horizontal movement mechanism 103 and the first photographing unit photographs a lower side of the electronic components C absorbed to the nozzle spindles 240.

Accordingly, operation S33 of correcting positions of the electronic components C depending on a position of the PCB B is taken after the inclination angle β1 of the PCB B is compared with a position of absorbed electronic components, and the nozzle spindles 240 are made to rotate independently concurrently with a rotation of least one rotation housing 230.

In an embodiment, as shown in FIG. 10B, it is possible to correct positions of the electronic components C depending on the inclination angle β1 of the PCB by rotating the nozzle spindles 240 by a fixed angle β2 by rotating the rotation housing 230 about the central portion O. However, the leads CL of electronic components absorbed to the nozzle spindles 240 are rotated by a fixed angle β2 by rotating the nozzle spindles 240. As a result, the leads CL are not situated parallel to the X axis.

Therefore, as shown in FIG. 10C, the nozzle spindles 240 themselves are rotated to correct a rotated angle of the electronic components C. Accordingly, the leads CL of the electronic components are rotated to be parallel to the X axis. Thus, it is possible to correct exactly positions of electronic components C required for absorption depending on an inclination angle β1 of the PCB.

Further, it is possible to mount the electronic components C on two or more PCB B at the same time. That is, as shown in FIGS. 10A to 10C, it is possible to arrange the electronic components C at a mounting position of the second PCB Bb by arranging (in a correct mounting position of the first PCB Ba) the first nozzle spindles 240a that absorb the electronic components C required for mounting in the first head assembly 201a, and by rotating the first nozzle spindle 240a and the second nozzle spindle 240b of the second head assembly 201b for mounting the electronic components.

In an embodiment, the rotation of the rotation housing 230 is caused by the rotation of a housing driving gear arranged at an end of the housing rotation unit. The rotation of the housing driving gear may depend upon the driving of the housing rotation unit and a housing driven gear which is mounted to the rotation housing 230 and which is connected to the housing driving gear and interlocked with its rotation.

The rotation of the nozzle spindles 240 is caused by a rotation of the nozzle driving gear, which is connected to the nozzle rotation unit, in response to the nozzle rotation unit. The nozzle driving gear is arranged in a central portion of the rotation housing and a plurality of nozzle driven gears that are coupled around the circumference of the nozzle spindles 240 and engaged with the nozzle driving gear.

Otherwise, depending on drive of the nozzle rotation unit, the rotation of the nozzle spindles 240 is possible by the rotation of the nozzle driving gear connected to the nozzle rotation unit, the nozzle driven gear coupled to the circumference of the nozzle spindles, and a ring gear of a hollow cylinder shape which is mounted for relative rotation to the rotation housing. In an embodiment, the ring gear has an outer circumferential surface in which an outside gear is formed to be connected to the nozzle driving gear and an inner circumferential surface in which an inside gear is formed to be connected to each nozzle driven gear.

Figure 11:
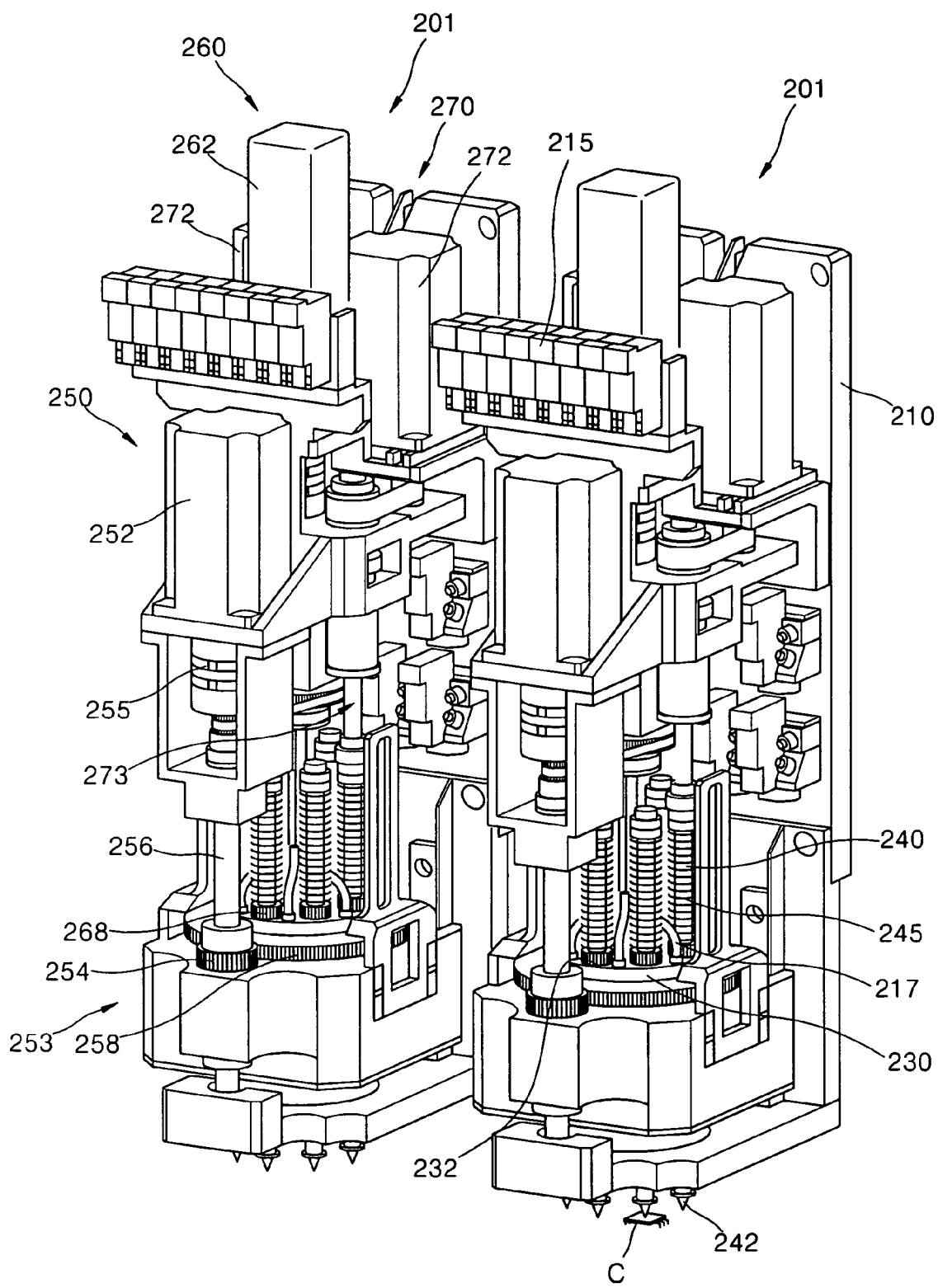
FIG. 11 is a perspective view illustrating head assemblies provided to the component mounting apparatus according to an embodiment of the present invention.

In another embodiment of the present invention, as shown in FIG. 11, a plurality of head assemblies 201 are provided to the component mounting apparatus 100 employing a method of mounting electronic components. As shown in FIG. 11, one head assembly 201 comprises the body 210, the rotation housing 230, and the nozzle spindles 240. The body 210 moves horizontally depending on a movement of the X axis movement mechanism 104 and the Y axis movement mechanism 105 and is generally coupled to the X axis movement mechanism 104. The rotation housing 230 is coupled to the body 210 in a manner that allows it to rotate as shown in FIG. 3.

Spindle housing holes 232 are formed at a predetermined gap around the same circumference about a central portion of the rotation housing 230, and the nozzle spindles 240 are housed inside each spindle housing hole 232. It is preferable that a spindle return spring 245 is formed outside or inside of the nozzle spindles 240. The nozzle spindles 240 are descended only when a force greater than an elastic force of the spindle return spring 245 is applied to the nozzle spindles 240 in the direction of their lower side. The descended nozzle spindles 240 return to a standby position when the force greater than an elastic force of the spindle return spring 245 is removed.

The inside of the nozzle spindles 240 takes the shape of a hollow cylinder. Air channels are formed at its hollow cylinder, and nozzles 242 for absorbing the electronic components C are coupled to its lower part. The nozzles descend concurrently with the supply of a negative pressure into the inside, pick up the electronic components C of the component supply unit 102 (see FIG. 3), and then ascend and move horizontally. Thereafter, the nozzles descend again and mount the electronic components to PCB B (see FIG. 3) by a positive pressure supplied into the inside.

The air channels of the nozzle spindles 240 are connected to a negative-pressure air supply unit and a positive-pressure air supply unit. The negative-pressure air supply unit of supplies air of a negative pressure into air channels of the nozzle spindles 240 so that the nozzles 242 absorb the electronic components C. The positive-pressure air supply unit supplies air of a positive pressure into the air channels of the nozzle spindles 240 in order to mount the electronic components C to the PCB B in the nozzles 242. In an embodiment, one solenoid valve 215 can separately supply air of a positive pressure and air of a negative pressure into the air channels of one nozzle spindle 240. The valve and air channel inside the nozzle 242 may be connected to each other by an air delivery pipe 217.

The component mounting apparatus 100 according to the present invention has a structure in which the nozzle spindles 240 can rotate by themselves and the nozzle spindles 240 can rotate by the rotation of the rotation housing 230. Therefore, in the present invention, a housing rotation mechanism 250 is provided in order to rotate the rotation housing 230, and a nozzle rotation mechanism 260 is provided in order to rotate the nozzle spindles 240 themselves.

The housing rotation mechanism 250 for rotating the rotation housing 230 comprises a housing rotation drive unit 252 and a housing rotation delivery unit 253. The housing rotation drive unit 252 mounted to the body 210 is generally a servo motor and rotates the rotation housing 230 by driving the housing rotation delivery unit 253. The housing rotation delivery unit 253 may be composed of, for example, a plurality of gear assemblies or provided with a belt or a chain.

Figure 12:
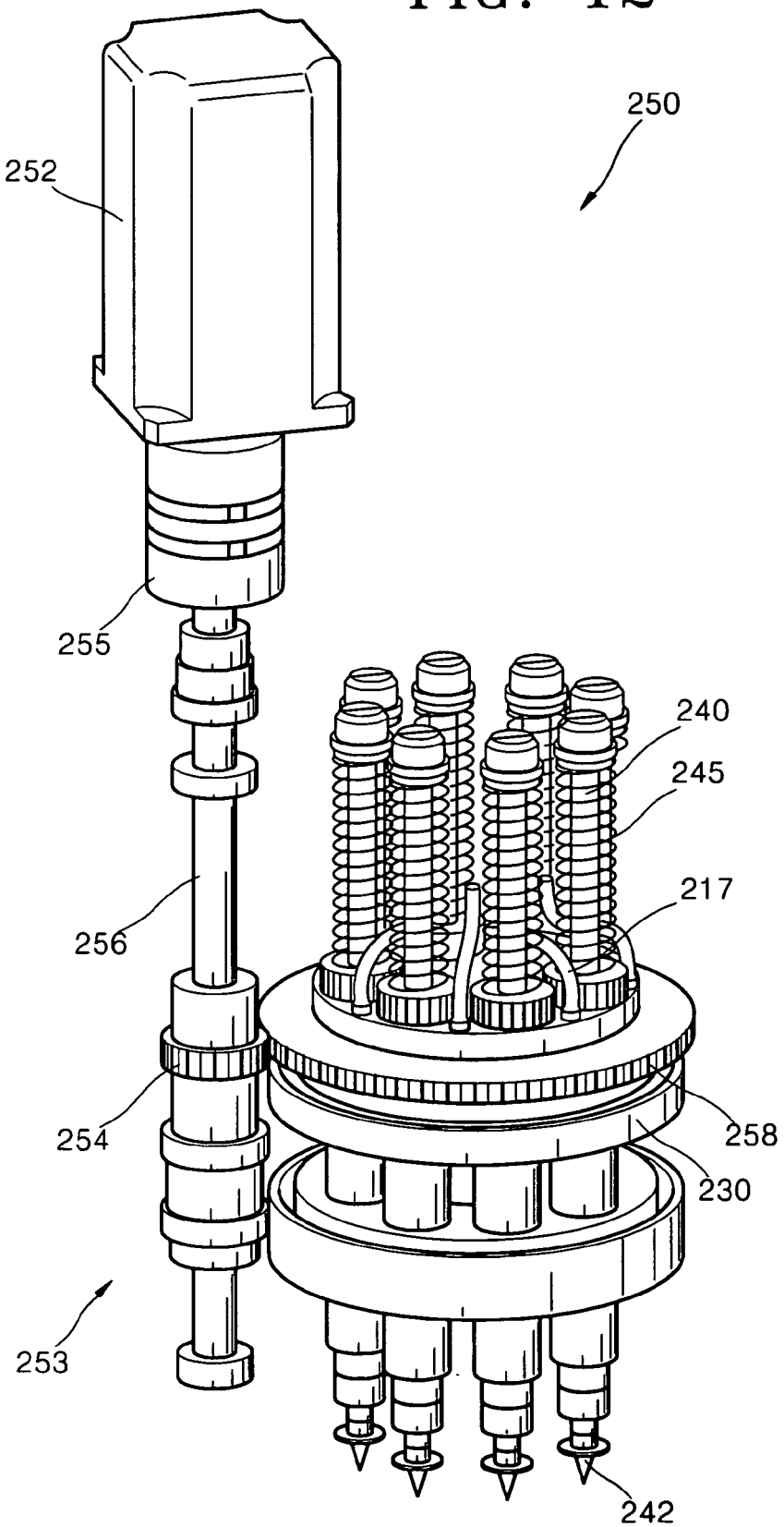
FIG. 12 is a perspective view illustrating a housing rotation mechanism shown in FIG. 11.

In an embodiment, referring to FIGS. 11 and 12, the housing rotation delivery unit 253 is a gear assembly consisting of a plurality of gears, and the housing rotation delivery unit 253 may be provided with a housing driving gear 254 and a housing driven gear 258.

The housing driving gear 254 is formed at one end of the housing rotation drive unit 252 and interlocked with the rotation of the housing rotation drive unit 252. In an embodiment, the housing driving gear 254 is coupled around a circumference surface of a spline shaft 256 and the spline shaft 256 may be coupled to the housing rotation drive unit 252 through a coupling device 255.

The housing driven gear 258 is coupled to the rotation housing 230 and is in mechanical communication with the housing driving gear 254. The housing driven gear 258 rotates. In an embodiment, the housing driven gear 258 may be arranged around a circumference surface of the rotation housing 230.

In an embodiment, at least one connection gear (not shown) may be arranged between the housing driving gear 254 and the housing driven gear 258. The connection gear is arranged to engage with one or more housing driven gears 258 depending on the shape of the head assembly 201 and performs a function of minimizing a size of the head assembly 201 and connecting between the housing driving gear 254 and the housing driven gear 258.

In an embodiment, it is preferable that the connection gear or the housing driven gear 258 is an anti-backlash gear and that at least one bearing is arranged between the rotation housing 230 and the body 210 to support smooth rotation of the rotation housing 230.

The function of the housing rotation mechanism 250 having such a structure is as follows. When the housing rotation drive unit 252 drives, the housing driving gear 254 arranged at an end of the housing rotation drive unit 252 rotates, whereby the housing driven gear 258 engaged with the housing driving gear 254 rotates. The rotation housing 230 rotates because the housing driven gear 258 is coupled to the circumference of the rotation housing 230.

On the other hand, as described above, the nozzle spindles 240 themselves may need to rotate in order to mount the electronic components at a correct position depending on an inclination angle β1 of the PCB. For this reason, the present invention comprises a nozzle rotation mechanism 260.

Figure 13:
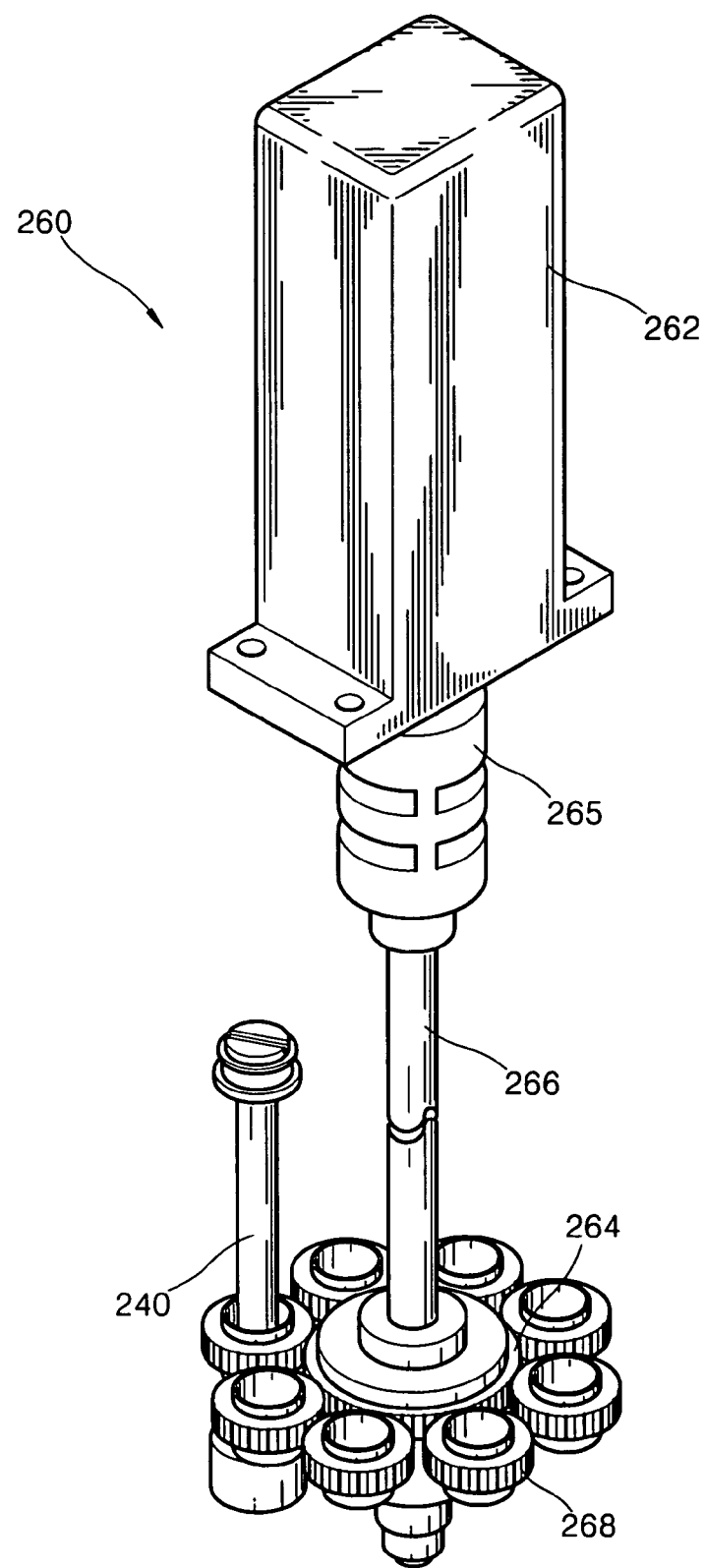
FIG. 13 is a perspective view illustrating an embodiment of the nozzle rotation mechanism shown in FIG. 11.

Specifically, as shown in FIG. 13, the nozzle rotation mechanism 260 comprises the nozzle rotation unit 262, the nozzle driving gear 264, and the nozzle driven gear 268. The nozzle rotation unit 262 coupled to the body is generally a servo motor and is connected to the nozzle driving gear 264. In an embodiment, the nozzle driving gear 264 is formed at an end of the nozzle rotation unit 262 and is interlocked with the rotation of the nozzle rotation unit 262. The nozzle driving gear 264 is coupled to a circumference surface of the spline shaft 266 and the spline shaft 266 may be coupled to the nozzle rotation unit 262 through a coupling device 265.

The nozzle driven gear 268 is coupled around a circumference surface of each nozzle spindle 240. Therefore, the nozzle spindles 240 rotate by the rotation of the nozzle driven gear 268.

The nozzle driving gear 264 may engage directly with each nozzle driven gear 268. In an embodiment, the nozzle driving gear 264 is situated at a central portion of the rotation housing 230 and engaged with a plurality of nozzle driven gears 268 formed around a circumference surface of a plurality of nozzle spindles 240 arranged around the same circumference as that of the rotation housing 230. Therefore, when one nozzle driving gear 264 rotates, the nozzle driven gears 268 engaged with the nozzle driving gear 264 may rotate. The nozzle driven gear 268 may be an anti-backlash gear.

Figure 14:
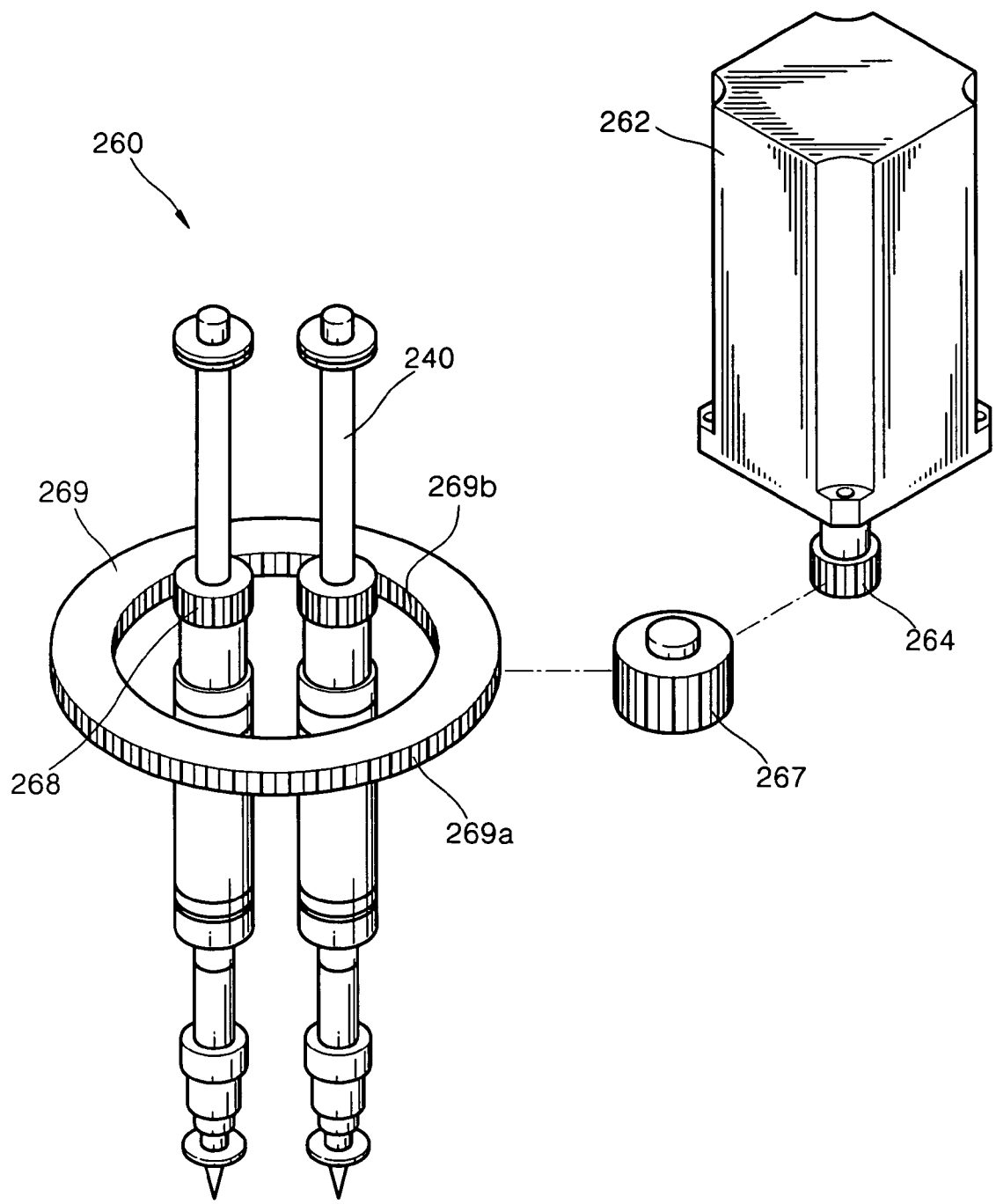
FIG. 14 is a perspective view illustrating an embodiment of the nozzle rotation mechanism shown in FIG. 11.

In another embodiment, as shown in FIG. 14, the nozzle driving gear 264 may be connected to the nozzle driven gear 268 through a ring gear 269. That is, the nozzle driving gear 264 and the nozzle driven gear 268 are respectively connected to the ring gear 269 coupled to the rotation housing 230 to enable the relative rotation. The ring gear 269 has a hollow cylinder shape and is formed around a circumference surface of the rotation housing 230. An outside gear unit 269a formed around the circumference surface of the ring gear 269 is connected to the nozzle driving gear 264 and an inner side gear unit 269b formed around an inner circumferential surface of the ring gear 269 is connected to each nozzle driven gear 268. Therefore, the ring gear 269 rotates depending on the rotation of the nozzle driving gear 264 and each nozzle driven gear 268 engaged with the ring gear 269 rotates, and thus the nozzle spindles 240 coupled to the nozzle driven gear 268 rotate.

Further, at least one connection gear 267 may be additionally provided, and the ring gear 269 and the nozzle driving gear 264 may be connected. A proper number of the connection gear 267 may be arranged depending on a structure of the head assembly, thus reducing a size of the whole head assembly 201 and transmitting a torque of the nozzle driving gear 264 to the ring gear 269. In an embodiment, it is preferable that the nozzle driven gear 268, the ring gear 269, and the connection gear 267 are formed to have no backlash. One example to avoid backlash among gears is that the connection gear 267 is a nozzle actually composed of two anti-backlash gears, one of which engages the driving gear 264 and the other of which engages the outside gear unit 269a of the ring gear, and each nozzle driven gear 268 is an anti-backlash gear.

In such a structure, the nozzle driving gear 264 arranged in an end of the nozzle rotation unit 262 rotates depending on the driving of the nozzle rotation unit 262. Accordingly, the ring gear 269 having an outside gear unit 269a engaged directly with the nozzle driving gear 264 or engaged with the connection gear 267 rotates, so that the nozzle driven gear 268 engaged with an inner side gear unit 269b of the ring gear 269 rotates. The nozzle driven gear 268 is fixed to a circumference surface of the nozzle spindles 240, whereby the nozzle spindles 240 rotate.

In the present invention, it is possible to modularize the head assembly 201 by simplifying a structure in which the nozzle spindles 240 are rotated and the nozzle spindles 240 themselves are rotated. That is, it is possible to absorb and mount the electronic components C by using the detachable head assembly 201 depending on the size of the electronic components C. In an embodiment, it is preferable that each head assembly 201 is detachably mounted to the horizontal movement mechanism 103. A head frame may be provided to the horizontal movement mechanism 103.

Figure 15:
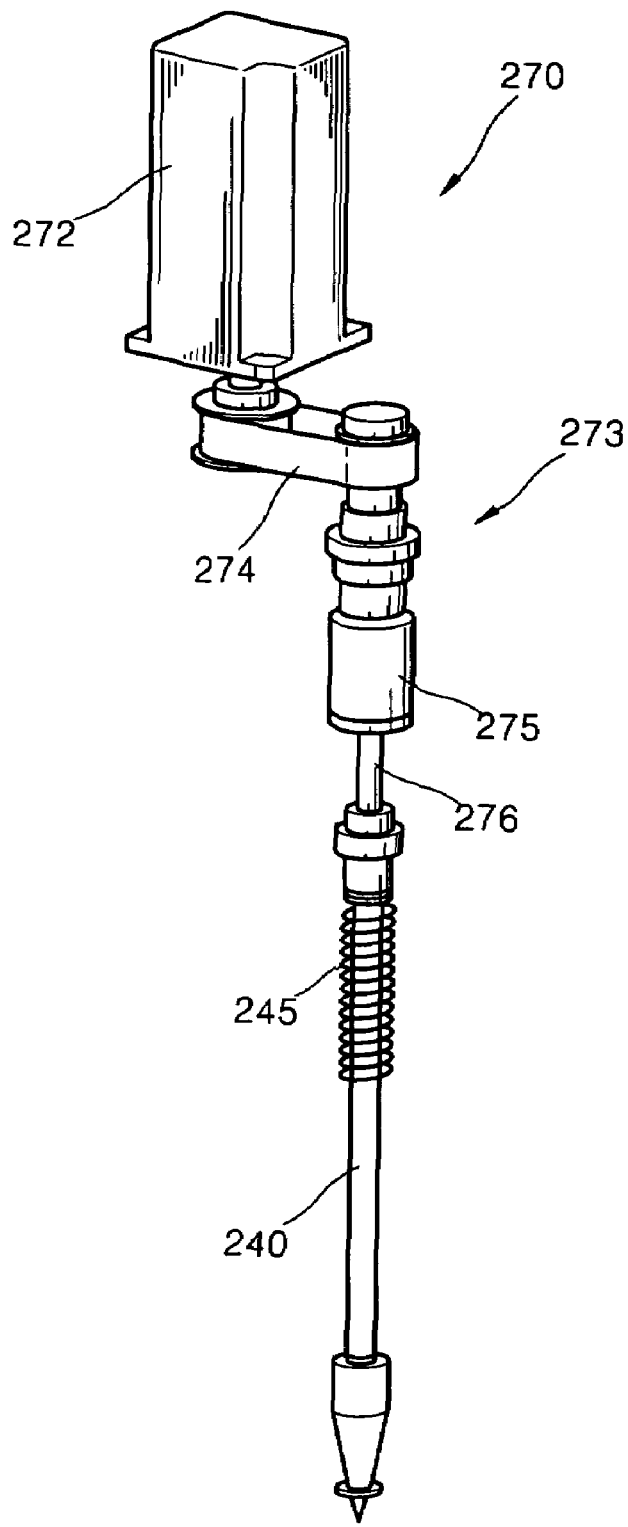
FIG. 15 is a perspective view illustrating a nozzle lift mechanism shown in FIG. 11.

On the other hand, as shown in FIGS. 11 and 15, the component mounting apparatus according to the present invention comprises a nozzle lift mechanism 270. As described above, in the present invention, it is preferable that a gap between the nozzle spindles 240 arranged opposite to each other about the rotation housing 230 in one head assembly 201 is one or more times the gap between centers of the adjacent component C supply units 102.

That is, as in FIG. 5, in one head assembly 201, it is preferable that a gap K1 between the nozzle spindles 240 arranged opposite to each other about the central portion O of the rotation housing is one or more times a gap P between centers of adjacent component supply units 102 because the nozzle spindles 240 provided to the one head assembly 201 and arranged opposite to each other about the central portion O of the rotation housing may descend at the same time and absorb electronic components from the component supply unit 102.

Therefore, it is preferable that the nozzle lift mechanism 270 of the present invention allows the nozzle spindles 240 arranged opposite to each other about the central portion of the rotation housing 230 to descend. The nozzle lift mechanism 270 may comprise a nozzle lift mechanism drive unit 272 and a clutch unit 273.

The nozzle lift mechanism drive unit 272 is mounted to the body 210 to correspond to the nozzle spindles 240 arranged opposite to each other about the central portion of the rotation housing 230 in the one head assembly 201. The clutch unit 273 is connected to the nozzle lift mechanism drive unit 272 and may descend the nozzle spindles 240 at the same time by pressing each nozzle spindle 240 arranged opposite to each other about the rotation housing 230 in the one head assembly 201, depending on the driving of the nozzle lifting unit 272.

The nozzle lift mechanism 270 may employ various kinds of methods such as a method of descending the nozzle spindles by using a hydraulic pressure, a method of descending the nozzle spindles by using a mechanical mechanism and so on. Referring to FIG. 15, in an embodiment, the clutch unit may comprise a descent pressing unit 276, a timing belt 274, and a ball screw 275. The nozzle lift mechanism drive unit 272 is connected to the descent pressing unit 276 through the timing belt 274 and the ball screw 275. Therefore, when the nozzle lift mechanism drive unit 272 drives, the descent pressing unit 276 receives rotational movement by the timing belt 274, the rotational movement is converted into vertical movement by the ball screw 275 and thus the descent pressing unit 276 is descended. The nozzle spindles 240 are arranged at a lower side of one descent pressing unit 276, so that the nozzle spindles 240 are descended because the descent pressing plate 276 presses the nozzle spindles 240.

The spindle return spring 245 is formed at the outside or inside of the nozzle spindles 240, so that the spindle return spring 245 may return the descended nozzle spindles 240 to a standby position when a pressing force of the descent pressing unit 276 is removed.

As in FIG. 6, it is preferable that a gap K1 between two nozzle spindles 240 provided to adjacent head assemblies 201 and arranged opposite to each other about the central portion O of the rotation housing 230 is the same as or two or three times, etc., a gap P between centers of the component supply unit 102 corresponding to the nozzle spindles 240 because it is possible for two nozzle spindles 240 provided to a different head assembly 201 to absorb a plurality of components C at the same time.

The rotation housing 230 may operate the housing rotation drive unit 252 in a way such that it rotates with a different speed in each head assembly 201. The nozzle spindles 240 provided to a different head assembly 201 may absorb a different-size of electronic components C at the same time.

A component mounting apparatus 100 according to the present invention having such a structure makes it possible each nozzle spindle 240 provided to a plurality of head assemblies 201 to absorb and mount electronic components C at the same time, thus reducing a mounting time.

Further, it is possible to rotate each nozzle spindle 240 itself and rotate each nozzle spindle 240, by rotating the rotation housing 230 so that a plurality of nozzle spindles 240 may descend at the same time and absorb components and mount simply and exactly electronic components C depending on an inclination angle $\alpha 1$, of the electronic components C that arrive at the component supply unit 102 and an inclination angle $\beta 1$ of the PCB transferred by a conveyor unit 106.

Further, it is possible to decrease a total weight of the head assembly, 201 increase the operation speed, and thus modularize the head assembly 201 because a structure for rotating the rotation housing 230 is simple and a small number of components are used.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of mounting components using a component mounting apparatus comprising at least one head assembly comprising a plurality of nozzle spindles, the method comprising:
   correcting the positions of the nozzle spindles by rotating a rotation housing;
   lowering at least one of the plurality of nozzle spindles;
   picking up a component with the lowered nozzle spindle;
   determining a mounting position inclination angle;
   correcting the position of the picked-up component based upon the determined mounting position inclination angle by rotating the rotation housing and also independently rotating the nozzle spindles, wherein rotating the nozzle spindle comprises:
      using a nozzle rotation unit to rotate a nozzle driving gear that is coupled to the nozzle rotation unit;
      arranging a plurality of nozzle driven gears around a circumference of the nozzle spindles;
      coupling the nozzle driven gears to the nozzle spindles, wherein the nozzle driven gears are in mechanical communication with the nozzle driving gear;
   moving the picked-up component over a printed circuit board; and
   mounting the picked-up component to a specified mounting position on the printed circuit board.

2. The method of claim 1, wherein the plurality of nozzle spindles are arranged opposite each other about the rotation housing in the head assembly and are separated by a gap of at least a distance between adjacent absorption positions.

3. The method of claim 1, wherein:
   the component mounting apparatus comprises with at least first and second head assemblies;
   the method further comprises moving at least one of the first and second head assemblies so that a nozzle spindle on the first head assembly is separated from an adjacent nozzle spindle on the second head assembly by a gap of at least a distance between centers of adjacent components supply units; and
   the picking up step comprises concurrently lowering a plurality of nozzle spindles of the first and second head assemblies.

4. The method of claim 1, wherein the component mounting apparatus comprises a plurality of head assemblies and the picking up step comprises:
   rotating a first rotation housing of a first head assembly of the plurality at a first speed, wherein the first rotation housing contains a first plurality of nozzle spindles which pick up a first plurality of components; and
   concurrently rotating a second rotation housing of a second head assembly at a second speed, wherein the second rotation housing contains a second plurality of nozzle spindles which pick up a second plurality of components, wherein the second plurality of components are of a different size than the first plurality of components.

5. The method of claim 1, wherein the step of rotating the rotation housing comprises:
   coupling a housing driven gear to the rotation housing, wherein the housing driven gear is in mechanical communication with a housing drive gear coupled to an end of a housing rotation drive unit; and
   driving the housing drive gear, thereby rotating the housing driven gear and the rotation housing.

6. The method of claim 1, wherein the positions of the nozzle spindles are corrected based upon an inclination angle of a component supply unit, the method further comprising:

perceiving an inclination angle of the components by photographing a plurality of components that arrive at specified pick-up positions; and in response thereto, rotating the rotation housing.

7. The method of claim 1, further comprising:

perceiving an inclination angle of specified mounting positions of the components by photographing a fiducial mark arranged on the printed circuit board and perceiving positions of the components picked-up by the nozzle spindles; and correcting positions of picked-up components based upon the determined mounting position inclination angle.

8. A method of mounting components using a component mounting apparatus comprising at least one head assembly comprising a plurality of nozzle spindles, the method comprising:

correcting the positions of the nozzle spindles by rotating a rotation housing;

lowering at least one of the plurality of nozzle spindles;

picking up a component with the lowered nozzle spindle;

determining a mounting position inclination angle;

correcting the position of the picked-up component based upon the determined mounting position inclination angle by rotating the rotation housing and also independently rotating the nozzle spindles, wherein rotating the nozzle spindle comprises:

coupling a ring gear to the rotation housing, the ring gear having an outer circumferential surface in which an outside gear is formed for mechanically communicating with a nozzle driving gear and an inner circumferential surface in which an inside gear is formed for mechanically communicating with a nozzle driven gear;

arranging a nozzle driven gear around a circumference of the nozzle spindles, wherein the nozzle driven gear is coupled to the nozzle spindles; and rotating a nozzle driving gear that is connected to a nozzle rotation unit, thereby rotating the ring gear, the nozzle driven gear, and the nozzle spindles;

moving the picked-up component over a printed circuit board; and mounting the picked-up component to a specified mounting position on the printed circuit board.

9. The method of claim 8, further comprising:

determining the angle of inclination of the printed circuit board;

determining the position of the picked-up component; and comparing the determined inclination angle with the determined component position.

* * * * *